US011592951B2

(12) United States Patent
Kishimoto et al.

(10) Patent No.: US 11,592,951 B2
(45) Date of Patent: Feb. 28, 2023

(54) DISPLAY DEVICE WITH RIGID MEMBER

(71) Applicant: SAMSUNG DISPLAY CO., LTD., Yongin-si (KR)

(72) Inventors: Hirotsugu Kishimoto, Hwaseong-si (KR); Da Som Gu, Asan-si (KR); Yong Hyuck Lee, Cheonan-si (KR); Chul Ho Jeong, Seoul (KR); Hyun Jun Cho, Seoul (KR); Soh Ra Han, Cheonan-si (KR); Hyun Been Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/318,411

(22) Filed: May 12, 2021

(65) Prior Publication Data

US 2022/0113824 A1     Apr. 14, 2022

(30) Foreign Application Priority Data

Oct. 13, 2020     (KR) .......................... 10-2020-0131696

(51) Int. Cl.
| | | |
|---|---|---|
| *G06F 3/046* | (2006.01) | |
| *H05K 7/20* | (2006.01) | |
| *H01L 27/32* | (2006.01) | |
| *H01L 51/00* | (2006.01) | |
| *H01L 51/52* | (2006.01) | |

(52) U.S. Cl.
CPC ............ *G06F 3/046* (2013.01); *H01L 27/323* (2013.01); *H01L 27/3244* (2013.01); *H01L 51/0097* (2013.01); *H01L 51/529* (2013.01); *H05K 7/20963* (2013.01);
(Continued)

(58) Field of Classification Search
CPC ......... H01L 2251/5338; H01L 51/0097; H01L 51/5246; H01L 27/3244; H01L 27/3258; G09F 9/301; G09F 15/0012; G09F 13/0413; G09F 3/0412; G09F 3/041; G06F 1/1652; G06F 1/1641; G06F 1/1616; G06F 1/1681; G06F 1/1618; G06F 2203/04102; G06F 2203/04103
See application file for complete search history.

(56) References Cited

U.S. PATENT DOCUMENTS

| | | | | |
|---|---|---|---|---|
| 2014/0022187 | A1* | 1/2014 | Jeong .................... | G06F 3/0446 345/173 |
| 2014/0267951 | A1* | 9/2014 | Lee ......................... | G06F 3/046 29/829 |

(Continued)

FOREIGN PATENT DOCUMENTS

| | | |
|---|---|---|
| KR | 10-2016-0121668 | 10/2016 |
| KR | 10-2022-0006669 | 1/2022 |
| KR | 10-2022-0939952 | 3/2022 |

*Primary Examiner* — Dong Hui Liang
(74) *Attorney, Agent, or Firm* — F. Chau & Associates, LLC

(57) ABSTRACT

A display device includes a display panel configured to display an image on a first surface thereof, a digitizer layer disposed on a second surface opposite to the first surface of the display panel and including first electrode patterns configured to generate a magnetic field and second electrode patterns configured to generate a magnetic field, a shield member disposed on a first surface of the digitizer layer, and a rigid member between the display panel and the shield member.

20 Claims, 16 Drawing Sheets

(52) U.S. Cl.
CPC .............. *G06F 2203/04102* (2013.01); *G06F 2203/04107* (2013.01); *H01L 2251/5338* (2013.01)

(56) References Cited

U.S. PATENT DOCUMENTS

| | | | |
|---|---|---|---|
| 2016/0054824 A1* | 2/2016 | Nurmi | G06F 1/1616 |
| | | | 345/173 |
| 2016/0116944 A1* | 4/2016 | Lee | H04M 1/022 |
| | | | 361/679.26 |
| 2016/0295685 A1* | 10/2016 | Ryu | G06F 1/1641 |
| 2018/0279489 A1* | 9/2018 | Ochi | H05K 5/0004 |
| 2018/0307338 A1* | 10/2018 | Park | G06F 1/1681 |
| 2019/0036068 A1* | 1/2019 | Kim | G06F 1/1652 |
| 2019/0237689 A1* | 8/2019 | Liu | H01L 51/5225 |
| 2020/0272202 A1* | 8/2020 | Wang | G09F 9/301 |
| 2021/0007229 A1* | 1/2021 | Gu | H05K 5/0017 |
| 2021/0168953 A1* | 6/2021 | Lee | G06F 1/1641 |
| 2021/0382367 A1* | 12/2021 | Hashimoto | G06F 1/00 |
| 2022/0011819 A1 | 1/2022 | Shin et al. | |
| 2022/0091889 A1 | 3/2022 | Kishimoto et al. | |

* cited by examiner

DISPLAY DEVICE WITH RIGID MEMBER

CROSS-REFERENCE TO RELATED APPLICATION

This application claims priority under 35 U.S.C. § 119 to Korean Patent Application No. 10-2020-0131696 filed on Oct. 13, 2020, the disclosure of which is incorporated by reference herein in its entirety.

TECHNICAL FIELD

The present disclosure relates to a display device. More particularly, the present disclosure relates to a display device with a rigid member.

DISCUSSION OF THE RELATED ART

Display devices are seeing increased use for a wide range of applications. For example, display devices have been applied to various electronic devices such as smart phones, digital cameras, notebook computers, navigation systems, and smart televisions (TVs).

Bendable or foldable display devices with bendable or foldable display areas have been developed to provide portability and wide display screens.

Recent display devices support touch input made with a user's appendage (e.g., finger) as well as touch input made with an electronic pen (e.g., a stylus pen). In some cases, touch input made with an electronic pen may be more precise than touch input made with a user's appendage. Additionally, in some cases, height differences in the wiring of a digitizer layer for detecting touch input from an electronic pen may cause a protective film disposed on the digitizer layer to become uneven. The unevenness in the protective film may become visible from the front of the display device when high-luminance light is incident on the front of the display device while the display device is not displaying an image.

SUMMARY

Embodiments of the present inventive concept provide a display device capable of preventing unevenness of a protective film that may be caused by differences in height in the wiring of a digitizer layer from becoming visible to a user.

According to an embodiment of the present inventive concept, a display device includes a display panel configured to display an image on a first surface thereof, a digitizer layer disposed on a second surface opposite to the first surface of the display panel and including first electrode patterns configured to generate a magnetic field and second electrode patterns configured to generate a magnetic field, a shield member disposed on a first surface of the digitizer layer, and a rigid member between the display panel and the shield member.

A thickness of the rigid member may be larger than a thickness of the digitizer layer. A thickness of the rigid member may be larger than a thickness of the shield member.

The display panel may include a folding area which is foldable or bendable, a first non-folding area which is disposed on one side of the folding area, and a second non-folding area which is disposed on the other side of the folding area.

The shield member may include a plurality of bars which overlap the folding area.

The shield member may include slits which are disposed between adjacent bars among the plurality of bars.

A width of each bar of the plurality of bars may be smaller than a width of the adjacent slit.

The shield member may include a first shield member which overlaps the first non-folding area in a thickness direction of the display panel, and a second shield member which overlaps the second non-folding area in the thickness direction of the display panel. A gap between the first shield member and second shield member may overlap the folding area.

The gap between the first shield member and second shield member may be smaller than the folding area.

The display device may further include a heat dissipation layer disposed on a first surface of the shield member.

The heat dissipation layer may include a first heat dissipation layer which overlaps the first non-folding area in a thickness direction of the display panel, and a second heat dissipation layer which overlaps the second non-folding area in the thickness direction of the display panel. A gap between the first heat dissipation layer and second heat dissipation layer may overlap the folding area.

The gap between the first heat dissipation layer and second heat dissipation layer may be smaller than the folding area.

The digitizer layer may be disposed between the rigid member and the shield member.

The digitizer layer may include a first digitizer layer which overlaps the first non-folding area, and a second digitizer layer which overlaps the second non-folding area. A gap between the first digitizer layer and second digitizer layer may overlap the folding area; and the gap between the first digitizer layer and second digitizer layer is smaller than the folding area.

The digitizer layer may be disposed between the display panel and the rigid member.

The rigid member includes a first rigid member which overlaps the first non-folding area, a second rigid member which overlaps the second non-folding area, and a plurality of bars which overlap the folding area. The plurality of bars may include a different material from the first rigid member and second rigid member.

The plurality of bars may include a metallic material. The first rigid member and second rigid member may include carbon or glass fibers.

The rigid member may include a polymer having carbon or glass fibers.

The rigid member may include a first rigid member which overlaps the first non-folding area, and a second rigid member which overlaps the second non-folding area. A gap between the first rigid member and second rigid member may overlap the folding area. The gap between the first and second rigid members may be smaller than the folding area.

The digitizer layer may include a base layer which has the first electrode patterns disposed on a top surface thereof and the second electrode patterns disposed on a bottom surface thereof. The first electrode patterns may extend in a first direction. The second electrode patterns may extend in a second direction which intersects the first direction.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
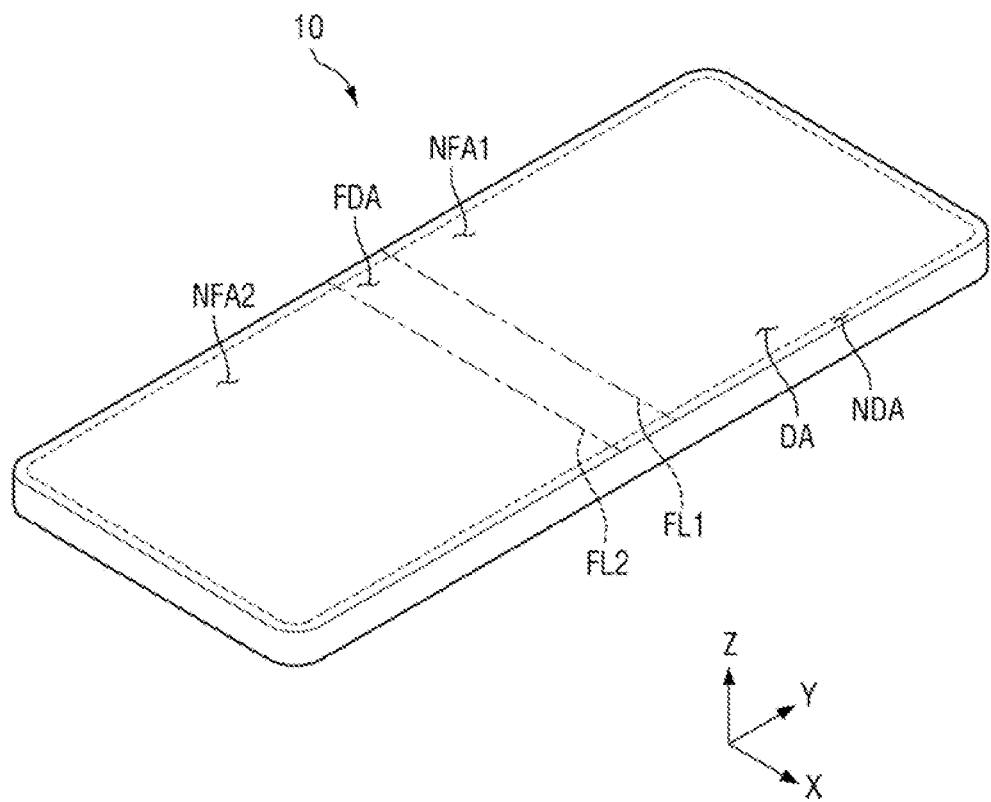
FIGS. 1 and 2 are perspective views of a display device according to an embodiment of the present disclosure.

Embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it may be directly on, connected, coupled, or adjacent to the other component, or intervening components may be present. It will also be understood that when a component is referred to as being "between" two components, it may be the only component between the two components, or one or more intervening components may also be present. It will also be understood that when a component is referred to as "covering" another component, it may be the only component covering the other component, or one or more intervening components may also cover the other component. Other words use to describe the relationship between elements may be interpreted in a like fashion.

It will be further understood that descriptions of features or aspects within each embodiment are available for other similar features or aspects in other embodiments, unless the context clearly indicates otherwise.

As used herein, descriptions of components in the singular form are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features may then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in one embodiment may be described as a "second" element in another embodiment.

Herein, when two or more elements or values are described as being substantially the same as or about equal to each other, it should be understood that the elements or values may be identical to each other, indistinguishable from each other, or distinguishable from each other but functionally the same as each other as would be understood by a person having ordinary skill in the art. Further, it should be understood that while parameters may be described herein as having "about" a certain value, according to embodiments, the parameter may be exactly the certain value or approximately the certain value within a measurement error as would be understood by a person having ordinary skill in the art.

Figure 2:
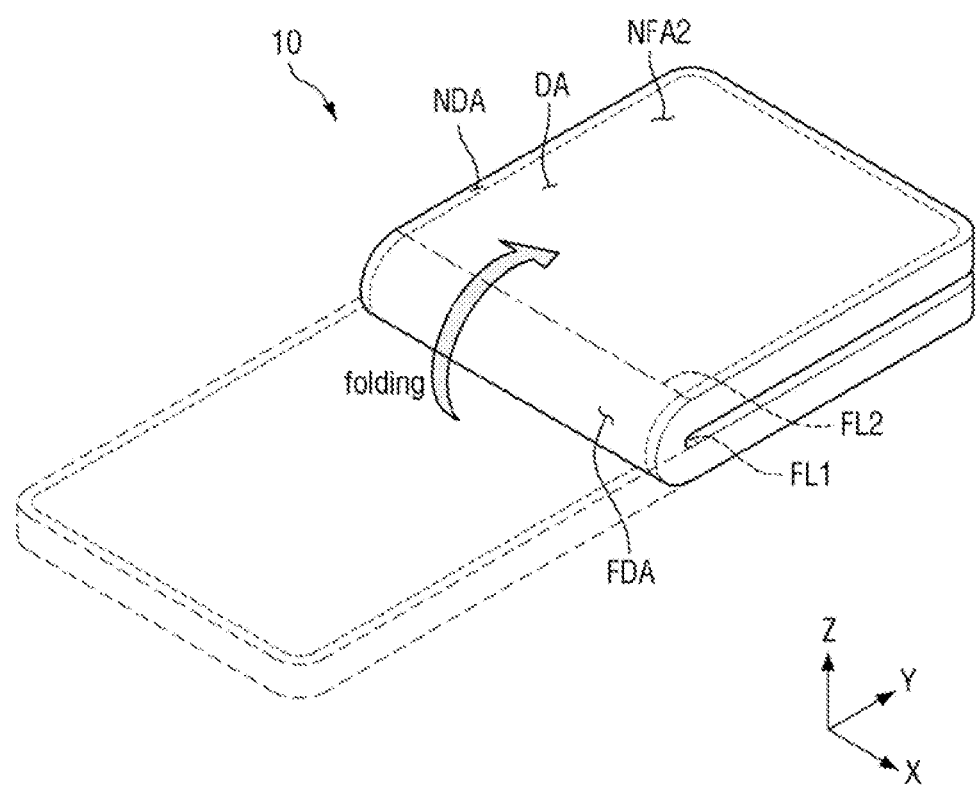

FIGS. 1 and 2 are perspective views of a display device according to an embodiment of the present disclosure. FIG. 1 is a perspective view of a display device according to an embodiment of the present disclosure in its unfolded state. FIG. 2 is a perspective view of the display device of FIG. 1 in its folded state.

Referring to FIGS. 1 and 2, a first direction (e.g., an X-axis direction), which is parallel to a first side of the display device 10 in a plan view, may be, for example, the widthwise direction of the display device 10. A second direction (e.g., a Y-axis direction), which is parallel to a second side of the display device 10 that meets the first side of the display device 10, in a plan view, may be, for example, the lengthwise direction of the display device 10. A third direction (e.g., a Z-axis direction) may be the thickness direction of the display device 10.

The display device 10 may have a rectangular or square shape in a plan view. In a plan view, the display device 10 may have a rectangular shape with right-angled or rounded corners. In a plan view, the display device 10 may include two short sides extending in the first direction (e.g., the X-axis direction) and two long sides extending in the second direction (e.g., the Y-axis direction).

The display device 10 may include a display area DA and a non-display area NDA. In a plan view, the shape of the display area DA may correspond to the shape of the display device 10. For example, the display device 10 may have a rectangular shape in a plan view, and the display area DA may also have a rectangular shape in a plan view.

The display area DA may include a plurality of pixels and display an image. The pixels may be arranged in rows and columns. The pixels may have a rectangular, rhombus, or square shape in a plan view, but the present disclosure is not necessarily limited thereto. For example, the pixels may have a tetragonal shape other than a rectangular, rhombus, or square shape, a non-tetragonal polygonal shape, a circular shape, or an elliptical shape in a plan view.

The non-display area NDA may be an area that does not include pixels and does not display an image. The non-display area NDA may be disposed around the display area DA. The non-display area NDA may surround the display area DA, as illustrated in FIGS. 1 and 2, but the present disclosure is not necessarily limited thereto. The display area DA may be surrounded in part by the non-display area NDA.

The display device 10 may be folded or unfolded without damage. The display device 10 may be folded in so that the display area DA may be placed on the inside of the display device 10, as illustrated in FIG. 2. In this case, portions of the front surface of the display device 10 may face each other. Alternatively, the display device 10 may be folded out so that the display area DA may be placed on the outside of the display device 10. In this case, portions of the rear surface of the display device 10 may face each other.

The display device 10 may include a folding area FDA, a first non-folding area NFA1, and a second non-folding area NFA2. The folding area FDA may be an area where the display device 10 is bent or folded, and the first and second non-folding areas NFA1 and NFA2 may be areas where the display device 10 is not bent or folded.

The first non-folding area NFA1 may be disposed on one side, for example, the upper side, of the folding area FDA. The second non-folding area NFA2 may be disposed on the other side, for example, the lower side, of the folding area FDA. The folding area FDA, which is defined by first and second folding lines FL1 and FL2, may be an area that can bend with a predetermined curvature. Thus, the first folding line FL1 may be defined as a boundary between the folding area FDA and the first non-folding area NFA1, and the second folding line FL2 may be defined as a boundary between the folding area FDA and the second non-folding area NFA2.

The first and second folding lines FL1 and FL2 may extend in the first direction (e.g., the X-axis direction), as illustrated in FIG. 1, in which case, the display device 10 may be folded up in the second direction (e.g., the Y-axis direction). As a result, the length in the second direction (e.g., the Y-axis direction), of the display device 10 may be reduced by about half so that a user may easily carry the display device 10 around.

In one example, the first and second folding lines FL1 and FL2 may extend in the first direction (e.g., the X-axis direction), as illustrated in FIGS. 1 and 2, and the length in the second direction (e.g., the Y-axis direction) of the folding area FDA may be smaller than its length in the first direction (e.g., the X-axis direction). The length in the second direction (e.g., the Y-axis direction) of the first non-folding area NFA1 may be greater than its length in the first direction (e.g., the X-axis direction). The length in the second direction (e.g., the Y-axis direction) of the second non-folding area NFA2 may be greater than its length in the first direction (e.g., the X-axis direction).

The display area DA and the non-display area NDA may overlap at least one of: the folding area FDA, the first non-folding area NFA1, and the second non-folding area NFA2. For example, FIGS. 1 and 2 illustrate that each of the display area DA and the non-display area NDA overlaps at least one of the folding area FDA, the first non-folding area NFA1, and the second non-folding area NFA2.

Figure 3:
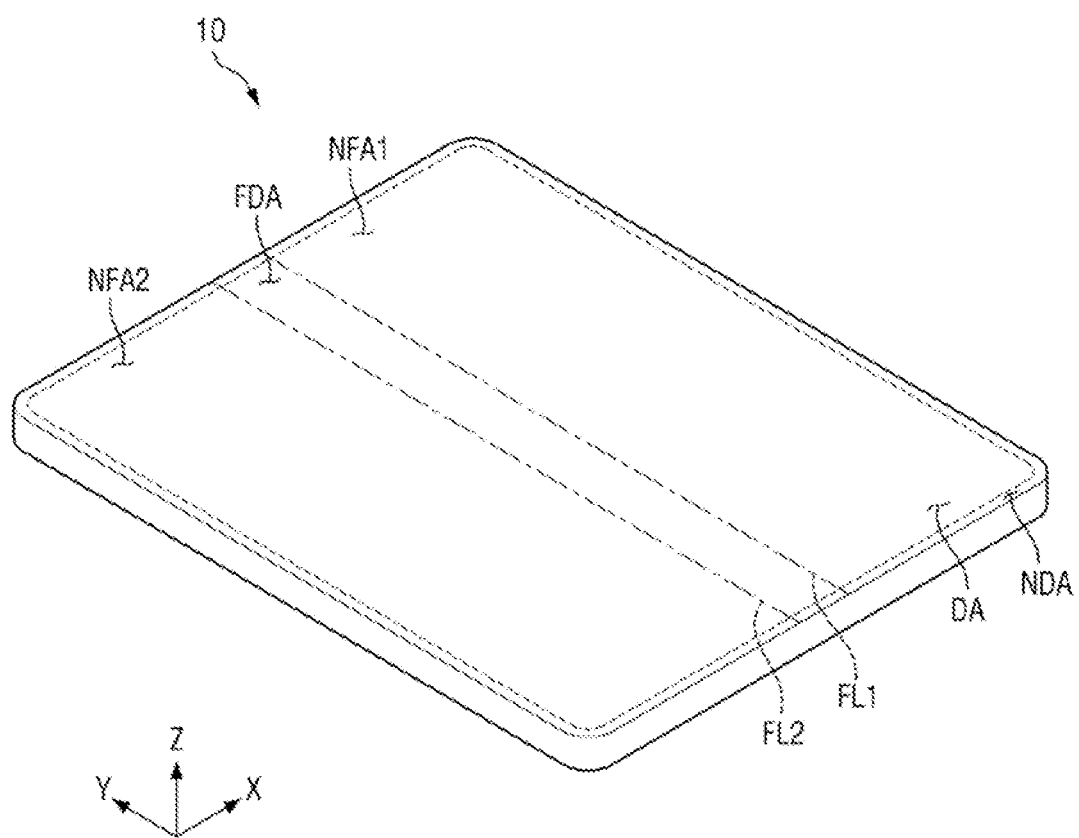
FIGS. 3 and 4 are perspective views of a display device according to an embodiment of the present disclosure.
Figure 4:
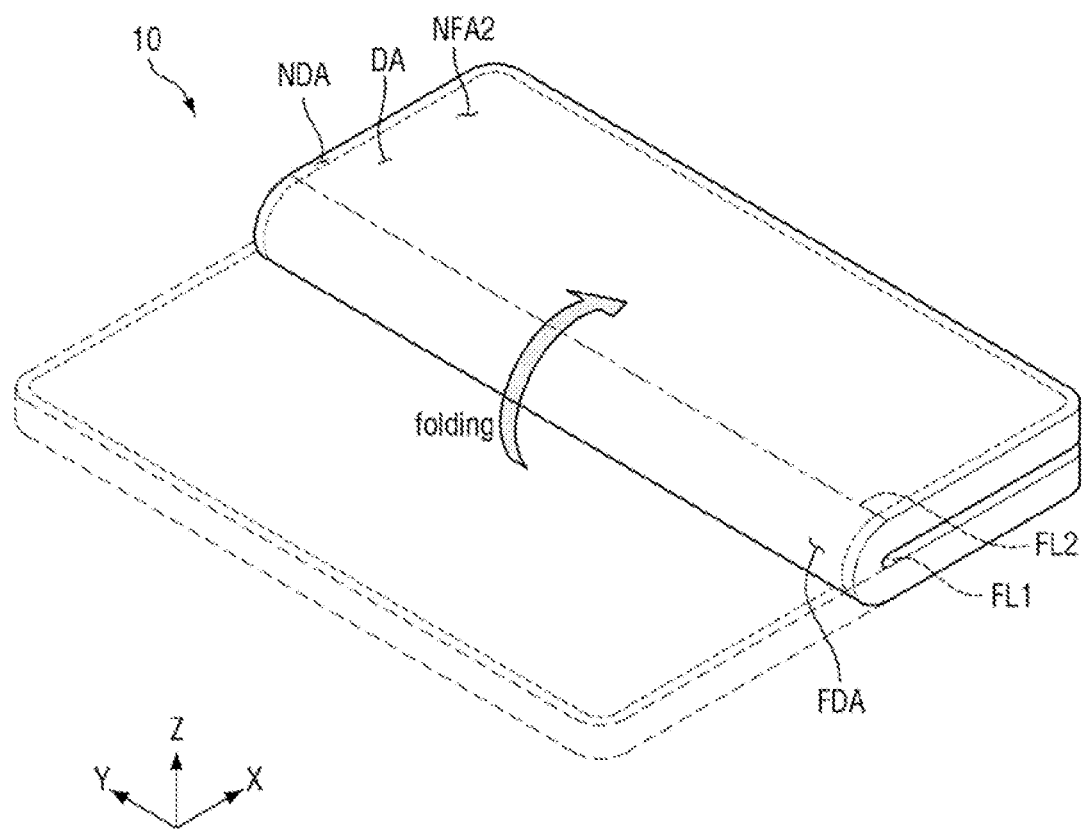

FIGS. 3 and 4 are perspective views of a display device according to an embodiment of the present disclosure. FIG. 3 is a perspective view of a display device according to an embodiment of the present disclosure in its unfolded state. FIG. 4 is a perspective view of the display device of FIG. 3 in its folded state.

The embodiment of FIGS. 3 and 4 differs from the embodiment of FIGS. 1 and 2 in that first and second folding lines FL1 and FL2 extend in the second direction (e.g., the Y-axis direction), and that a display device 10 is folded up in the first direction (e.g., the X-axis direction) so that the length, in the first direction (e.g., the X-axis direction), of the display device 10 can be reduced by about half. As a result, a user can easily carry the display device 10 around. The elements of FIGS. 3 and 4 are similar to those of FIGS. 1 and 2, except in that the illustrated embodiment folds along a different direction, and accordingly, a detailed description of the embodiment of FIGS. 3 and 4 will be omitted.

Figure 5:
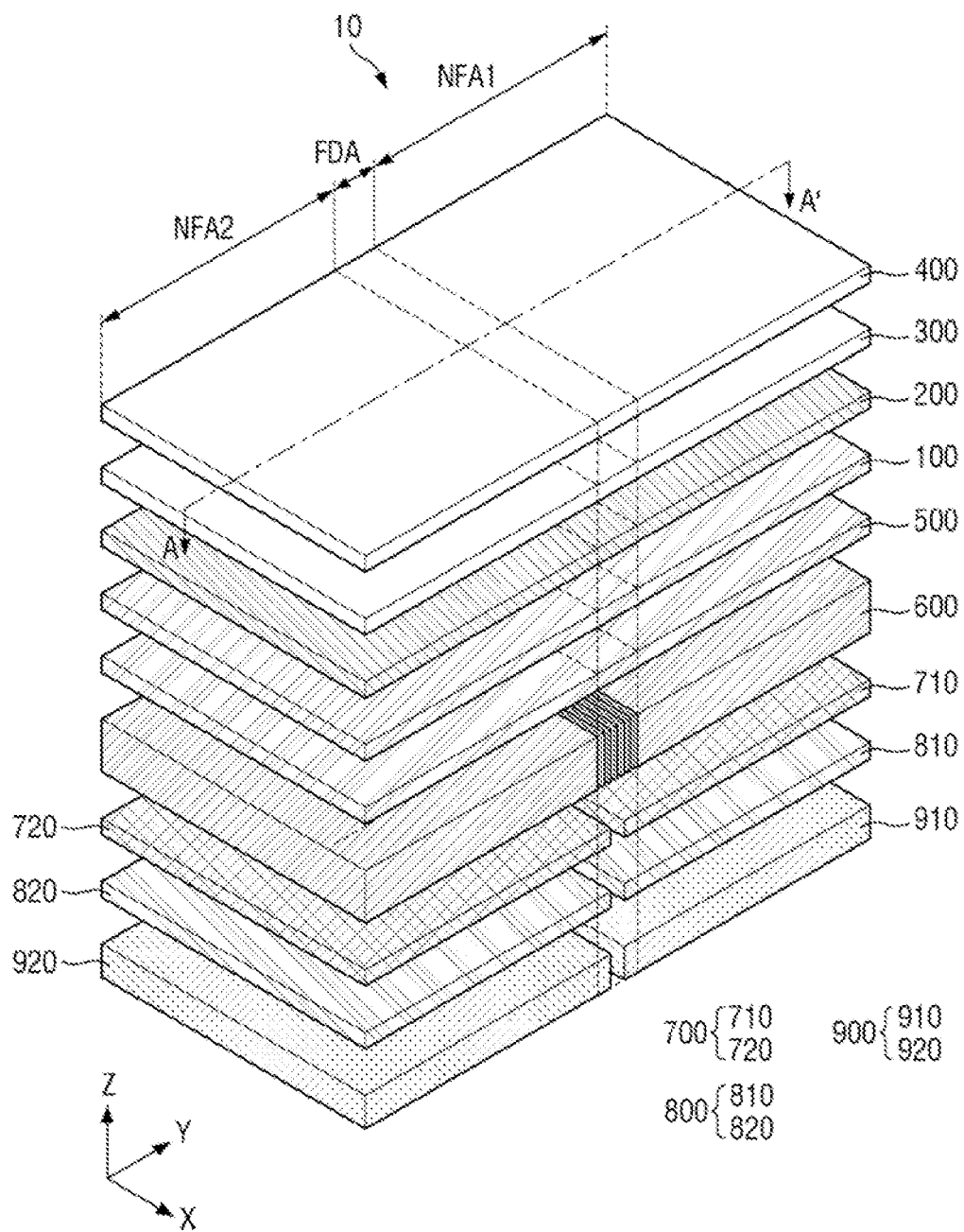
FIG. 5 is an exploded perspective view of the display device of FIG. 1.
Figure 6:
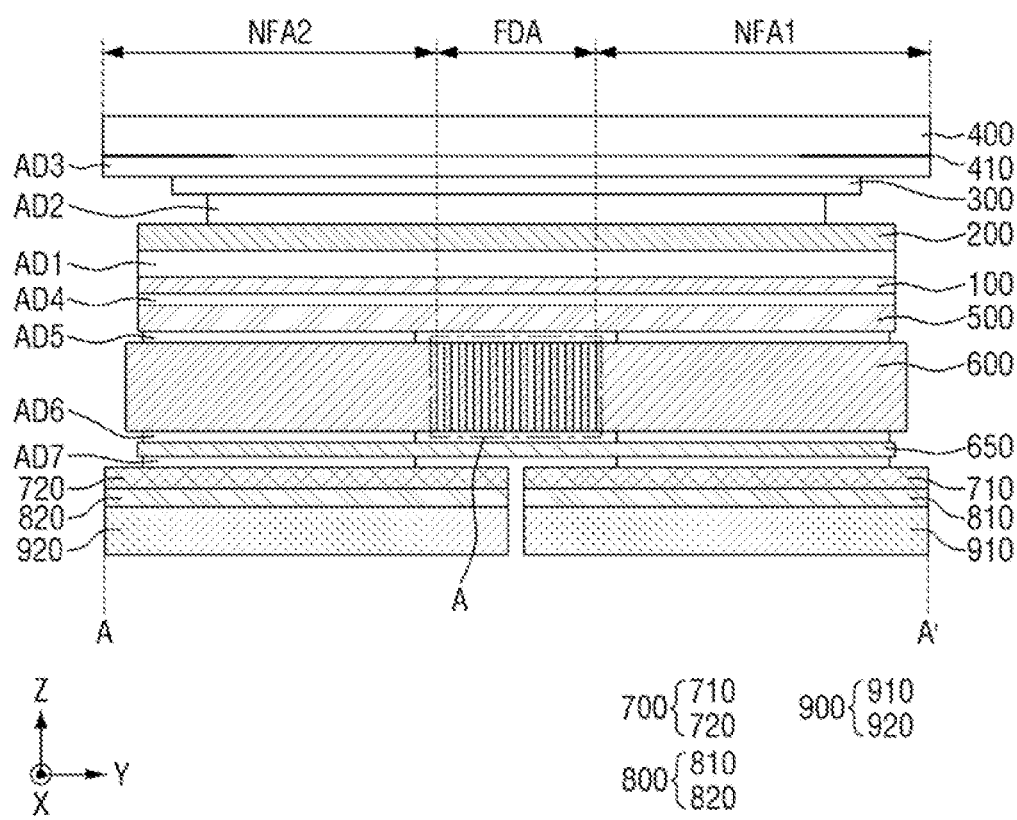
FIG. 6 is a cross-sectional view taken along line A-A' of FIG. 5.
Figure 7:
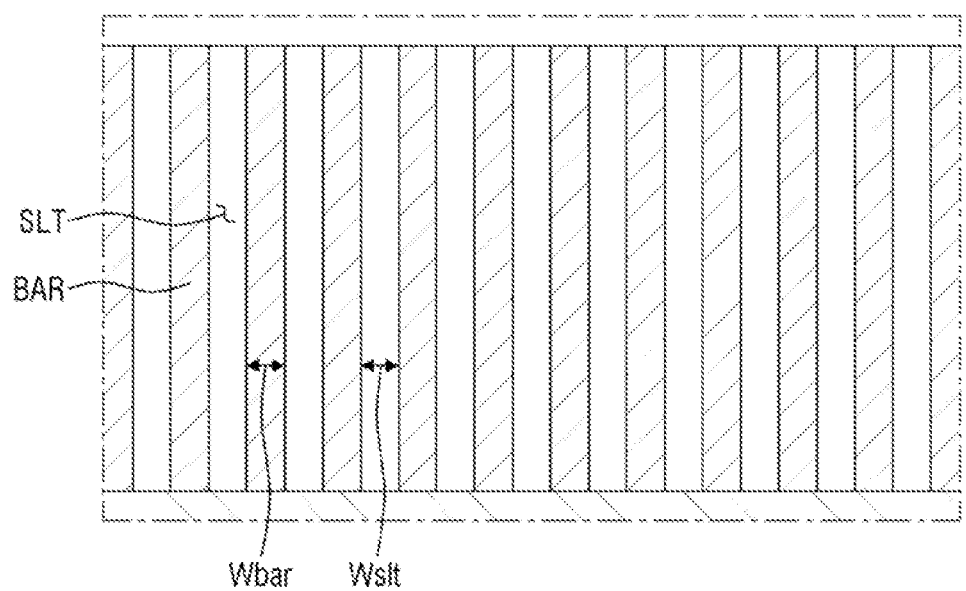
FIG. 7 is an enlarged cross-sectional view of an area A of FIG. 6.

FIG. 5 is an exploded perspective view of the display device of FIG. 1. FIG. 6 is a cross-sectional view taken along line A-A' of FIG. 5.

Referring to FIGS. 5 and 6, the display device 10 may include a display panel 100, a polarizing film 200, a window 300, a window protecting film 400, a panel protecting film 500, a rigid member 600, a digitizer layer 700, a shield member 800, and a heat dissipation member 900.

The display panel 100 may be an organic light-emitting display panel using organic light-emitting diodes (OLEDs), a quantum-dot light-emitting display panel including a quantum-dot light-emitting layer, an inorganic light-emitting display panel including an inorganic semiconductor, or a micro-light-emitting display panel using micro light-emitting diodes (LEDs). The display panel 100 will hereinafter be described as being an organic light-emitting display panel, but the present disclosure is not necessarily limited thereto. The display panel 100 will be described later in detail with reference to FIG. 8.

The polarizing film 200 may be disposed on the front surface of the display panel 100. The front surface of the display panel 100 may be a display surface where an image is displayed. The polarizing film 200 may be attached to the front surface of the display panel 100 via a first adhesive member AD1. The first adhesive member AD1 may be an optically clear adhesive (OCA) film or an optically clear resin (OCR). The polarizing film 200 may include a linear polarizing plate and a phase delay film such as a quarter-wave ($\lambda$/4) plate.

The window 300 may be disposed on the front surface of the polarizing film 200. The window 300 may be attached to the front surface of the polarizing film 200 via a second adhesive member AD2. The second adhesive member AD2 may be an OCA film or an OCR. The window 300 may be a transparent material such as glass or plastic. For example, the window 300 may be ultra-thin glass (UTG) or a transparent polyimide film having a thickness of 0.1 mm or less, but the present disclosure is not necessarily limited thereto.

The window protecting film 400 may be disposed on the front surface of the window 300. The window protecting film 400 may be attached to the front surface of the window 300 via a third adhesive member AD3. The third adhesive member AD3 may be an OCA film or an OCR. The window protecting film 400 may have at least one of the following properties: anti-scattering, shock-absorbing, scratch-resistant, anti-fingerprint, and anti-glare properties.

A light-blocking layer 410 may be disposed on a rear surface of the window protecting film 400. The light-blocking layer 410 may be disposed along the edge of the window protecting film 400. The light-blocking layer 410 may include a material capable of blocking light. For example, the light-blocking layer 410 may include an inorganic black pigment such as carbon black or an organic black pigment.

The panel protecting film 500 may be disposed on a rear surface of the display panel 100. The panel protecting film 500 may be attached to the rear surface of the display panel 100 via a fourth adhesive member AD4. The fourth adhesive member AD4 may be a pressure sensitive adhesive (PSA).

The panel protecting film 500 may support the display panel 100 and may protect the rear surface of the display panel 100. The panel protecting film 500 may be a plastic film such as a polyterephthalate (PET) film or glass.

FIGS. 5 and 6 illustrate an example embodiment where the panel protecting film 500 is disposed in the folding area FDA, but the present disclosure is not necessarily limited thereto. Alternatively, the panel protecting film 500 may be removed from the folding area FDA so that the display device 10 can be easily folded.

The rigid member 600 may be disposed on the rear surface of the panel protecting film 500. The rigid member 600 may be attached to the rear surface of the panel protecting film 500 via fifth adhesive members AD5. The fifth adhesive members AD5 may not be disposed in the folding area FDA to reduce the folding stress of the display device 10. One of the fifth adhesive members AD5 may be disposed in the first non-folding area NFA1, and the other fifth adhesive member AD5 may be disposed in the second non-folding area NFA2. The fifth adhesive members AD5 may be PSAs. The rigid member 600 may include a polymer containing carbon fibers or glass fibers. In an embodiment where the rigid member 600 includes carbon fibers, the polymer may contain epoxy, polyester, polyamide, polycarbonate, polypropylene, polybutylene, or vinyl ester. In an embodiment where the rigid member 600 includes glass fibers, the polymer may contain epoxy, polyester, polyamide, or vinyl ester.

The rigid member 600 may include a rigid material whose shape or volume is resistant to change by pressure from the outside. To this end, the rigid member 600 may have a thickness of about 100 µm to 300 µm, but the present disclosure is not necessarily limited thereto. The thickness of the rigid member 600 may be greater than the thickness of the digitizer layer 700 or the thickness of the shield member 800. Also, the thickness of the rigid member 600 may be greater than the thickness of the display panel 100. In an embodiment where the rigid member 600 includes carbon fibers, the rigid member 600 may have a Young's modulus of about 20 GPa to about 30 GPa. In an embodiment where the rigid member 600 includes glass fibers, the rigid member 600 may have a Young's modulus of about 70 GPa to about 130 GPa.

The rigid member 600 may include a plurality of bars "BAR" disposed in the folding area FDA to facilitate the bending or folding of the rigid member 600. The longwise direction in which the bars "BAR" extend may be substantially the same as the direction in which the first and second folding lines FL1 and FL2 extend. For example, the bars "BAR" may extend in the first direction (e.g., the X-axis direction). The bars "BAR" may be arranged in the second direction (e.g., the Y-axis direction). Slits "SLT" may be disposed between the bars "BAR". If a width Wbar of the bars "BAR" is greater than a width Wslt of the slits "SLT", the rigid member 600 may not be able to be easily bent or folded. Thus, the width Wbar of the bars "BAR" may be smaller than the width Wslt of the slits "SLT".

The rigid member 600 may have a structure in which a plurality of prepregs are stacked. For example, the rigid member 600 may include first prepregs in which carbon fiber yarn or glass fiber yarn extends parallel to the first and second folding lines FL1 and FL2 and second prepregs in which the carbon fiber yarn or the glass fiber yarn extends to perpendicularly cross the first and second folding lines FL1 and FL2. The width of the carbon fiber yarn or the glass fiber yarn may be about 7 µm to about 10 µm, but the present disclosure is not necessarily limited thereto. The first prepregs and the second prepregs may be alternately stacked. The first prepregs and the second prepregs may be stacked by a hot press or an auto clave.

A buffer member 650 may be disposed on the rear surface of the rigid member 600. The buffer member 650 may be attached to the rear surface of the rigid member 600 via sixth adhesive members AD6. The sixth adhesive members AD6 may not be disposed in the folding area FDA to reduce the folding stress of the display device 10. One of the sixth adhesive members AD6 may be disposed in the first non-folding area NFA1, and the other sixth adhesive member AD6 may be disposed in the second non-folding area NFA2. The sixth adhesive members AD6 may be PSAs.

The buffer member 650 absorbs external shocks and may prevent the rigid member 600 and the digitizer layer 700 from being damaged. The buffer member 650 may include an elastic material such as rubber, a urethane-based material, or a sponge obtained by foaming an acrylic material.

The digitizer layer 700 may include first and second digitizer layers 710 and 720. The first and second digitizer layers 710 and 720 may be disposed on the rear surface of the buffer member 650. The first and second digitizer layers 710 and 720 may be attached to the rear surface of the buffer member 650 via seventh adhesive members AD7. The seventh adhesive members AD7 may include PSAs.

The first digitizer layer 710, the second digitizer layer 720, and the seventh adhesive members AD7 may not be disposed in the folding area FDA to reduce the folding stress of the display device 10. The first digitizer layer 710 and one of the seventh adhesive members AD7 may be disposed in the first non-folding area NFA1, and the second digitizer layer 720 and the other seventh adhesive member AD7 may be disposed in the second non-folding area NFA2. The gap between the first and second digitizer layers 710 and 720 may overlap the folding area FDA and may be narrower than the folding area FDA. The width of the folding area FDA may correspond to the length in the second direction (e.g., the Y-axis direction) of the folding area FDA.

The first and second digitizer layers 710 and 720 may include electrode patterns for detecting the approach or contact of an electronic pen such as a stylus pen that supports electromagnetic resonance (EMR). The first and second digitizer layers 710 and 720 may detect a magnetic field or an electromagnetic signal from the electronic pen from on the electrode patterns. The first and second digitizer layers 710 and 720 may determine a location where a strongest magnetic field or electromagnetic signal is detected as the coordinates of touch input. The digitizer 700 will be described later in further detail with reference to FIGS. 9 and 10.

The shield member 800 may include first and second shield members 810 and 820. The first and second shield members 810 and 820 may be disposed on the rear surface of the digitizer layer 700.

The first and second shield members 810 and 820 may not be disposed in the folding area FDA to reduce the folding stress of the display device 10. The first shield member 810 may be disposed in the first non-folding area NFA1, and the second shield member 820 may be disposed in the second non-folding area NFA2. The gap between the first and second shield members 810 and 820 may overlap the folding area FDA and may be narrower than the folding area FDA.

In an example embodiment, the first and second shield members 810 and 820 include magnetic metal powder, and the magnetic field or electromagnetic signal passing through the digitizer layer 700 may flow into the first and second shield members 810 and 820. The first and second shield members 810 and 820 can lower the risk of a magnetic field or electromagnetic signal being emitted through the rear surfaces thereof.

The heat dissipation member 900 may include first and second heat dissipation members 910 and 920. The first and second heat dissipation members 910 and 920 may be disposed on the rear surface of the shield member 800.

The first and second heat dissipation members 910 and 920 may not be disposed in the folding area FDA to reduce the folding stress of the display device 10. The first heat dissipation member 910 may be disposed in the first non-folding area NFA1, and the second heat dissipation member 920 may be disposed in the second non-folding area NFA2. The gap between the first and second heat dissipation members 910 and 920 may overlap the folding area FDA and may be narrower than the folding area FDA.

The first and second heat dissipation members 910 and 920 may be metal films that include a metal with excellent thermal conductivity such as copper, nickel, ferrite, or silver. Accordingly, heat generated by the display device 10 may be released to the outside by the first and second heat dissipation members 910 and 920.

As illustrated in FIG. 6, since the rigid member 600 is disposed on the digitizer layer 700 and the shield member 800, and is formed of a rigid material whose shape or volume is resistant to change by pressure from the outside, unevenness may be prevented in the rigid member 600 even if there are height differences in the electrode patterns of the digitizer layer 700. Accordingly, unevenness may also be prevented in the protective film 500. Therefore, any unevenness in the protective film 500 due to height differences in the wiring of the digitizer layer 700 may be prevented from becoming visible from the front of the display device 10 in response to high-luminance light being applied to the front of the display device 10 when the display device 10 does not display an image.

Figure 8:
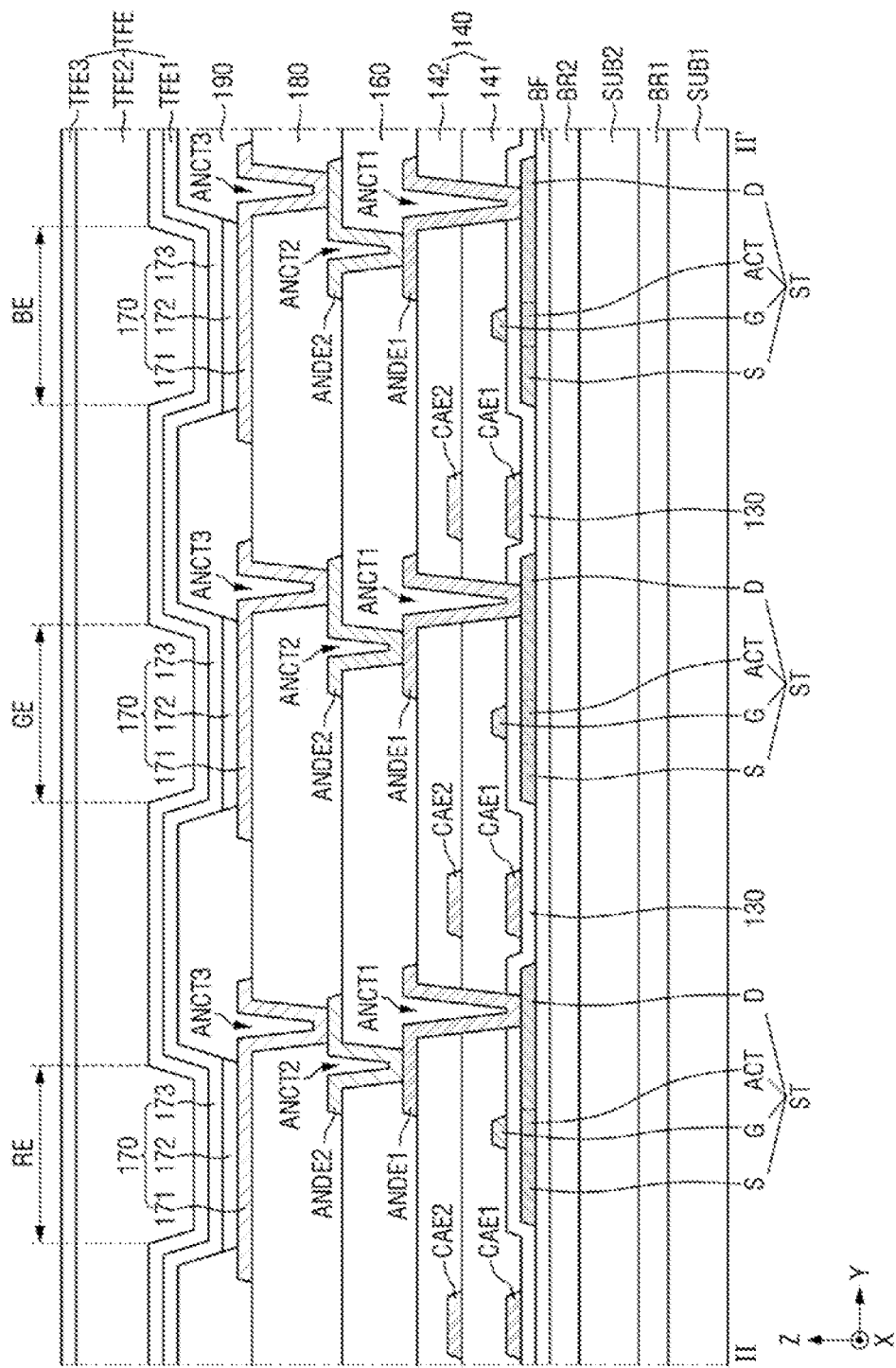
FIG. 8 is a cross-sectional view of a display panel of FIG. 6.

FIG. 8 is a cross-sectional view of a display panel of FIG. 6. FIG. 8 illustrates an cross-sectional view of the display area of the display panel of FIG. 6.

Referring to FIG. 8, a first barrier film BR1 may be disposed on a first substrate SUB1, a second substrate SUB2 may be disposed on the first barrier film BR1, and a second barrier film BR2 may be disposed on the second substrate SUB2.

The first and second substrates SUB1 and SUB2 may include an insulating material such as a polymer resin. For example, the first and second substrates SUB1 and SUB2 may include polyimide. The first and second substrates SUB1 and SUB2 may be flexible substrates that are bendable, foldable, or rollable.

The first and second barrier films BR1 and BR2 may protect thin-film transistors (TFTs) "ST" of a TFT layer TFTL and light-emitting layers 172 of a light-emitting element layer EML from moisture that may penetrate the first and second substrates SUB1 and SUB2, which are susceptible to moisture. Each of the first and second barrier films BR1 and BR2 may include a plurality of inorganic films that are alternately stacked. For example, the first and second barrier films BR1 and BR2 may be formed as multilayer films in which one or more of a silicon nitride layer, a silicon oxynitride layer, a silicon oxide layer, a titanium oxide layer, and an aluminum oxide layer are alternately stacked.

A buffer film BF may be disposed on the second barrier film BR2. The buffer film BF may consist of at least one inorganic film. For example, the buffer film BF may include at one or more of a silicon nitride layer, a silicon oxynitride layer, a silicon oxide layer, a titanium oxide layer, and an aluminum oxide layer that are alternately stacked.

The TFTs "ST" may be disposed on the buffer film BF. The TFTs "ST" may include active layers ACT, gate electrodes G, source electrodes S, and drain electrodes D.

The active layers ACT, the source electrodes S, and the drain electrodes D may be disposed on the buffer film BF. The active layers ACT may include polycrystalline silicon, monocrystalline silicon, low-temperature polycrystalline silicon, amorphous silicon, or an oxide semiconductor. The source electrodes S and the drain electrodes D may be obtained by doping a silicon semiconductor or an oxide semiconductor with ions or impurities to impart conductivity. The active layers ACT may overlap the gate electrodes G in the third direction (e.g., the Z-axis direction), and the source electrodes S and the drain electrodes D may overlap the gate electrodes G in the third direction (e.g., the Z-axis direction).

A gate insulating film 130 may be disposed on the active layers ACT, the source electrodes S, and the drain electrodes D of the TFTs "ST". The gate insulating film 130 may include an inorganic film such as, for example, a silicon nitride layer, a silicon oxynitride layer, a silicon oxide layer, a titanium oxide layer, or an aluminum oxide layer.

The gate electrodes G and first capacitor electrodes CAE1 may be disposed on the gate insulating film 130. The gate electrodes G may overlap the active layers ACT in the third direction (e.g., the Z-axis direction). The first capacitor electrodes CAE may overlap second capacitor electrodes CAE2 in the third direction (e.g., the Z-axis direction). The gate electrodes G and the first capacitor electrodes CAE1 may be formed as single layers or multilayers including molybdenum (Mo), aluminum (Al), chromium (Cr), gold (Au), titanium (Ti), nickel (Ni), neodymium (Nd), copper (Cu), or an alloy thereof.

A first interlayer insulating film 141 may be disposed on the gate electrodes G and the first capacitor electrodes CAE1. The first interlayer insulating film 141 may include an inorganic film such as a silicon nitride layer, a silicon oxynitride layer, a silicon oxide layer, a titanium oxide layer, or an aluminum oxide layer. The first interlayer insulating film 141 may include a plurality of inorganic films.

The second capacitor electrodes CAE2 may be disposed on the first interlayer insulating film 141. The second capacitor electrodes CAE2 may overlap the gate electrodes G in the third direction (e.g., the Z-axis direction). The first interlayer insulating film 141 may have a predetermined dielectric constant, and capacitors may be formed by the first capacitor electrodes CAE1, the second capacitor electrodes CAE2, and the first interlayer insulating film 141, which is disposed between the first capacitor electrodes CAE1 and the second capacitor electrodes CAE2. The second capacitor electrodes CAE2 may be formed as a single layer or a multilayer including Mo, Al, Cr, Au, Ti, Ni, Nd, Cu, or an alloy thereof.

A second interlayer insulating film 142 may be disposed on the second capacitor electrodes CAE2. The second interlayer insulating film 142 may be include an inorganic film such as, for example, a silicon nitride layer, a silicon oxynitride layer, a silicon oxide layer, a titanium oxide layer, or an aluminum oxide layer. The second interlayer insulating film 142 may include a plurality of inorganic films.

First anode connecting electrodes ANDE1 may be disposed on the second interlayer insulating film 142. The first anode connecting electrodes ANDE1 may be connected to the drain electrodes D through first anode contact holes ANCT1, which penetrate the first and second interlayer insulating films 141 and 142 to expose the drain electrodes D. The first anode connecting electrodes ANDE1 may be formed as single layers or as multilayers including Mo, Al, Cr, Au, Ti, Ni, Nd, Cu, or an alloy thereof.

A first organic film 160 for planarization may be disposed on the first anode connecting electrodes ANDE1. The first organic film 160 may include an organic film including an acrylic resin, an epoxy resin, a phenolic resin, a polyamide resin, or a polyimide resin.

Second anode connecting electrodes ANDE2 may be disposed on the first organic film 160. The second anode connecting electrodes ANDE2 may be connected to the first anode connecting electrodes ANDE1 through second anode contact holes ANCT2, which penetrate the first organic film 160 to expose the first anode connecting electrodes ANDE1. The second anode connecting electrodes ANDE2 may be formed as single layers or as multilayers including Mo, Al, Cr, Au, Ti, Ni, Nd, Cu, or an alloy thereof.

A second organic film 180 may be disposed on the second anode connecting electrodes ANDE2. The second organic film 180 may include an organic film including an acrylic resin, an epoxy resin, a phenolic resin, a polyamide resin, or a polyimide resin.

FIG. 8 illustrates that the TFTs "ST" are formed as top-gate TFTs in which the gate electrodes G are disposed above the active layers ACT, but the present disclosure is not necessarily limited thereto. Alternatively, the TFTs "ST" may be formed as bottom-gate TFTs in which the gate electrodes G are disposed below the active layers ACT or as double-gate TFT's in which the gate electrodes G are disposed both above and below the active layers ACT.

Light-emitting elements 170 and a bank 190 may be disposed on the second organic film 180. The light-emitting elements 170 may include first light-emitting electrodes 171, the light-emitting layers 172, and a second light-emitting electrode 173.

The first light-emitting electrodes 171 may be formed on the second organic film 180. The first light-emitting electrodes 171 may be connected to the second anode connecting electrodes ANDE2 through third anode contact holes ANCT3, which penetrate the second organic film 180 to expose the second anode connecting electrodes ANDE2.

In a top emission structure that emits light in a direction from the light-emitting layers 172 to the second light-emitting electrode 173, the first light-emitting electrodes 171 may include a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, or a stack of an APC alloy and ITO (e.g., ITO/APC/ITO).

The bank 190 may be formed on the second organic film 180 to divide the first light-emitting electrodes 171 and thus to define emission areas (RE, GE, and BE). The bank 190 may cover the edges of the first light-emitting electrodes 171. The bank 190 may include an organic film including an acrylic resin, an epoxy resin, a phenolic resin, a polyamide resin, or a polyimide resin.

The emission areas (RE, GE, and BE) may refer to areas where the first light-emitting electrodes 171, the light-emitting layers 172, and the second light-emitting electrode 173 are sequentially stacked and holes from the first light-emitting electrodes 171 and electrons from the second light-emitting electrode 173 are combined together in the light-emitting layers 172 to emit light.

The light-emitting layers 172 are formed on the first light-emitting electrodes 171 and the bank 190. The light-emitting layers 172 may include an organic material and may emit light of a particular color. For example, the light-emitting layers 172 may include hole transport layers, organic material layers, and electron transport layers.

The second light-emitting electrode 173 is formed on the light-emitting layers 172. The second light-emitting electrode 173 may cover the light-emitting layers 172. The second light-emitting electrode 173 may be a common layer formed in common for all the emission areas (RE, GE, and BE). A capping layer may be formed on the second light-emitting electrode 173.

In the top emission structure, the second light-emitting electrode 173 may include a transparent conductive material such as ITO or indium zinc oxide (IZO) capable of transmitting light therethrough or a semitransparent conductive material such as magnesium (Mg), Ag, or an alloy of Mg and Ag. In an embodiment where the second light-emitting electrode 173 is formed of a semitransparent conductive material, the emission efficiency of the light-emitting elements 170 may be increased due to a micro-cavity effect.

An encapsulation layer TFE may be disposed on the second light-emitting electrode 173. The encapsulation layer TFE may include at least one inorganic film to prevent oxygen or moisture from penetrating the light-emitting element layer EML. The encapsulation layer TFE may additionally include at least one organic film to protect the light-emitting element layer EML from a foreign material such as dust. For example, the encapsulation layer TFE may include a first inorganic film TFE1, an organic film TFE2, and a second inorganic film TFE3.

The first inorganic film TFE1 may be disposed on the second light-emitting electrode 173, the organic film TFE2 may be disposed on the first inorganic film TFE1, and the second inorganic film TFE3 may be disposed on the organic film TFE2. The first and second inorganic films TFE1 and TFE3 may include multilayer films in which at one or more of a silicon nitride layer, a silicon oxynitride layer, a silicon oxide layer, a titanium oxide layer, and an aluminum oxide layer are alternately stacked. The organic film TFE2 may include an organic film including an acrylic resin, an epoxy resin, a phenolic resin, a polyamide resin, or a polyimide resin.

Figure 9:
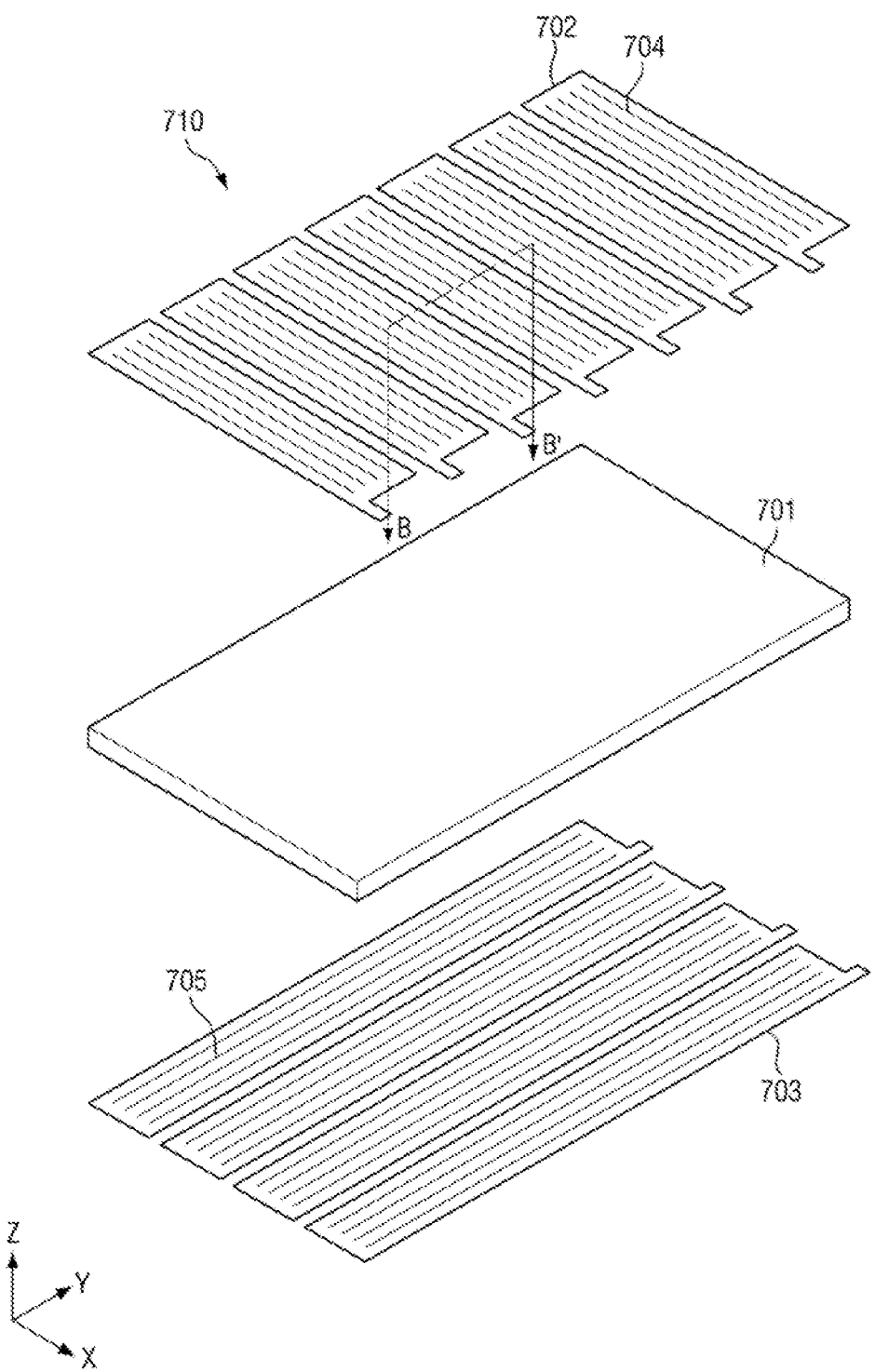
FIG. 9 is an exploded perspective view of a first digitizer layer of FIG. 6.
Figure 10:
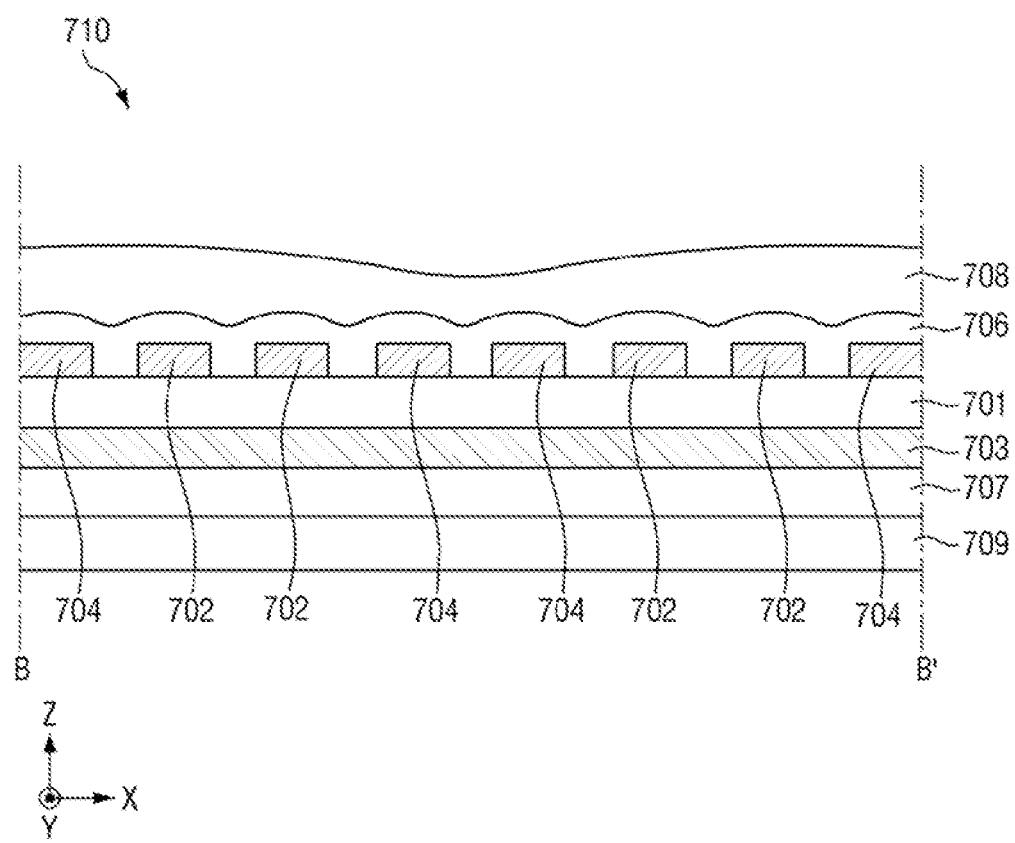
FIG. 10 is a cross-sectional view taken along line B-B' of FIG. 9.

FIG. 9 is an exploded perspective view of the first digitizer layer of FIG. 6. FIG. 10 is a cross-sectional view taken along line B-B' of FIG. 9.

Referring to FIGS. 9 and 10, the first digitizer layer 710 may include a base layer 701, first electrode patterns 702, second electrode patterns 703, first dummy patterns 704, second dummy patterns 705, a first adhesive layer 706, a second adhesive layer 707, a first cover layer 708, and a second cover layer 709.

The base layer 701 may have flexibility and may include an insulating material. For example, the base layer 701 may include polyimide.

The first electrode patterns 702 and the first dummy patterns 704 may be disposed on the front surface of the base layer 701. The second electrode patterns 703 and the second dummy patterns 705 may be disposed on the rear surface of the base layer 701.

The first electrode patterns 702 may extend in the first direction (e.g., the X-axis direction). The first electrode patterns 702 may be arranged in the second direction (e.g., the Y-axis direction). The first electrode patterns 702 may have a loop shape in a plan view. The second electrode patterns 703 may extend in the second direction (e.g., the Y-axis direction). The second electrode patterns 703 may be arranged in the first direction (e.g., the X-axis direction). The second electrode patterns 703 may have a loop shape in a plan view.

The first electrode patterns 702 and the second electrode patterns 703 may intersect one another. A magnetic field or an electromagnetic signal from an electronic pen may be absorbed by the first electrode patterns 702 and the second electrode patterns 703, and as a result, a determination can be made as to which part of the digitizer layer 700 is approached by the electronic pen.

Alternatively, the first electrode patterns 702 and the second electrode patterns 703 may form a magnetic field based on an input current, and the magnetic field or an electromagnetic signal may be absorbed by an electronic pen. The electronic pen may emit the absorbed magnetic field, and the electronic magnetic field emitted by the electronic pen may be absorbed by the first electrode patterns 702 and the second electrode patterns 703. The first electrode patterns 702 and the second electrode patterns 703 may convert the magnetic field or electromagnetic field from the electronic pen into an electrical signal.

FIG. 9 illustrates that the first electrode patterns 702 and the second electrode patterns 703 have a rectangular loop shape in a plan view, but the present disclosure is not necessarily limited thereto. Alternatively, the first electrode patterns 702 and the second electrode patterns 703 may have a rhombus or hexagonal loop shape in a plan view.

In an embodiment where the first electrode patterns 702 have a rectangular loop shape in a plan view, opposing sides of each of the first electrode patterns 702 may be distant. Thus, regions where the first electrode patterns 702 are disposed may protrude in a thickness direction, and regions where the first electrode patterns 702 are not disposed may be relatively recessed. In order to prevent unevenness in the digitizer layer 700, one or more first dummy patterns 704 may be surrounded by each of the first electrode patterns 702.

The first dummy patterns 704 may extend in the first direction (e.g., the X-axis direction). The first dummy patterns 704 may be arranged in the second direction (e.g., the Y-axis direction). The distance between the first dummy patterns 704 that are surrounded by each of the first electrode patterns 702 may be uniform.

In an embodiment where the second electrode patterns 703 have a rectangular loop shape in a plan view, opposing sides of each of the second electrode patterns 703 may be distant. Thus, regions where the second electrode patterns 703 are disposed may protrude in a thickness direction, and regions where the second electrode patterns 703 are not disposed may be relatively recessed. In order to prevent unevenness in the digitizer layer 700, one or more second dummy patterns 705 may be surrounded by each of the second electrode patterns 703.

The second dummy patterns 705 may extend in the second direction (e.g., the Y-axis direction). The second dummy patterns 705 may be arranged in the first direction (e.g., the X-axis direction). The distance between the second dummy patterns 705 that are surrounded by each of the second electrode patterns 703 may be uniform.

The first electrode patterns 702, the first dummy patterns 704, the second electrode patterns 703, and the second dummy patterns 705 may include a metallic material such as Cu, Ag, Ni, or W.

The first adhesive layer 706 may be disposed on the base layer 701 (for example, the first adhesive layer 706 may be above the base layer 701), the first electrode patterns 702, and the first dummy patterns 704. The first cover layer 708 may be disposed on the first adhesive layer 706. The first cover layer 708 may be attached to the base layer 701 via the first adhesive layer 706. The first adhesive layer 706 may be a PSA. The first cover layer 708 may have flexibility and may include an insulating material. For example, the first cover layer 708 may include polyimide.

The second adhesive layer 707 may be disposed on the base layer 701 (for example, the second adhesive layer 707 may be below the base layer 701), the second electrode patterns 703, and the second dummy patterns 705. The second cover layer 709 may be disposed on the second adhesive layer 707. The second cover layer 709 may be attached to the base layer 701 via the second adhesive layer 707. The second adhesive layer 707 may be a PSA. The second cover layer 709 may have flexibility and may include an insulating material. For example, the second cover layer 709 may include polyimide.

Figure 11:
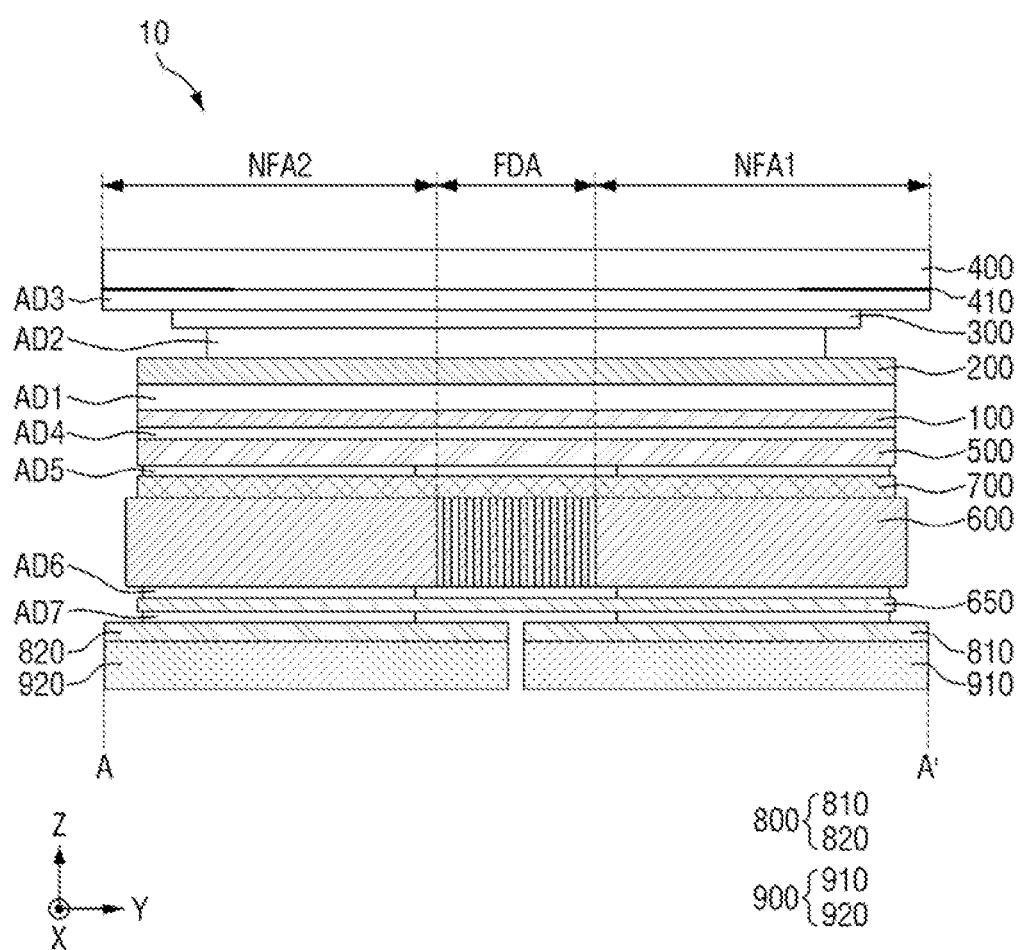
FIG. 11 is a cross-sectional view, taken along line A-A' of FIG. 5, of a display device according to an embodiment of the present disclosure.

FIG. 11 is a cross-sectional view, taken along line A-A' of FIG. 5, of a display device according to an embodiment of the present disclosure.

The embodiment of FIG. 11 differs from the embodiment of FIG. 6 in that a digitizer layer 700 is disposed on the front surface of a rigid member 600 and is integrally formed in and across a folding area FDA, a first non-folding area NFA1, and a second non-folding area NFA2. The elements of FIG. 11 are otherwise similar to those of FIG. 6, and accordingly, a description of the embodiment of FIG. 11 will be omitted.

Figure 12:
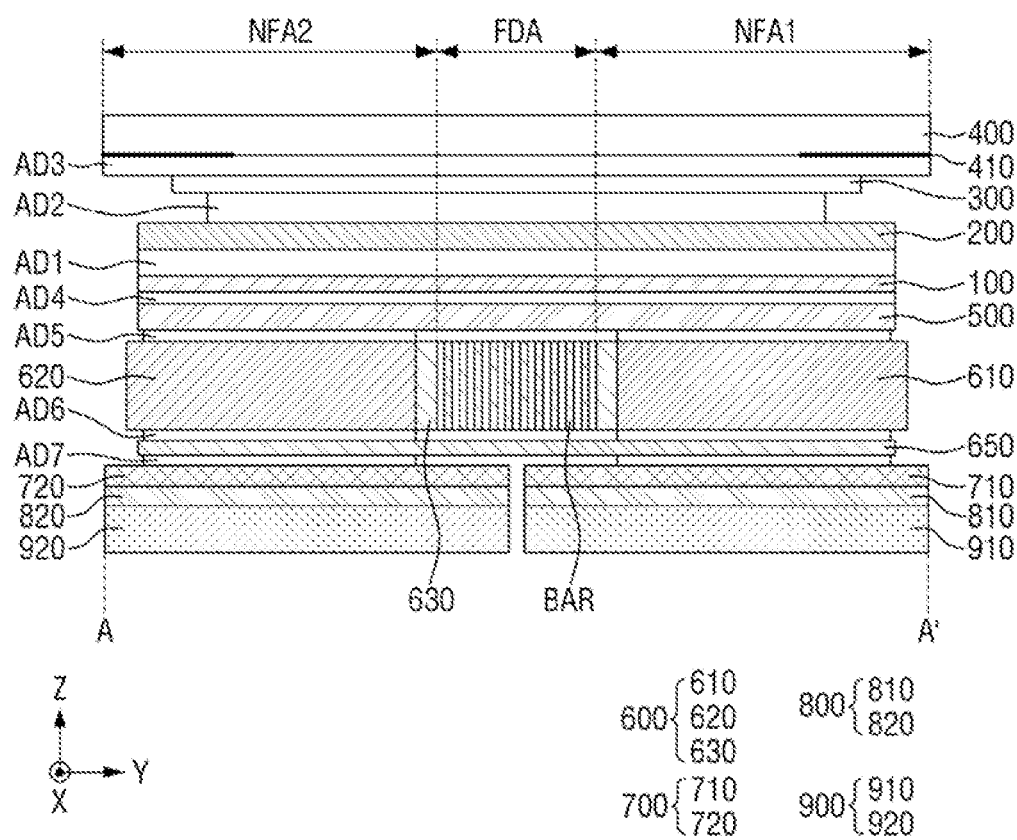
FIG. 12 is a cross-sectional view, taken along line A-A' of FIG. 5, of a display device according to an embodiment of the present disclosure.

FIG. 12 is a cross-sectional view, taken along line A-A' of FIG. 5, of a display device according to an embodiment of the present disclosure.

The embodiment of FIG. 12 differs from the embodiment of FIG. 6 in that a rigid member 600 includes first, second, and third rigid members 610, 620, and 630. The embodiment of FIG. 12 will hereinafter be described, focusing mainly on the differences with the embodiment of FIG. 6.

Referring to FIG. 12, the first rigid member 610 may be disposed in a first non-folding area NFA1, the second rigid member 620 may be disposed in a second non-folding area NFA2, and the third rigid member 630 may be disposed in a folding area FDA. The third rigid member 630 may include a plurality of bars "BAR".

The first and second rigid members 610 and 620 may include a polymer containing carbon or glass fibers, as already described above with reference to FIG. 6. By contrast, the third rigid member 630 may include a metallic material. In this case, as a metal is more stretchable than a polymer, the folding stress of the rigid member 600 can be reduced. Also, the bars "BAR" and slits "SLT" of the third rigid member 630 may be easily formed.

Figure 13:
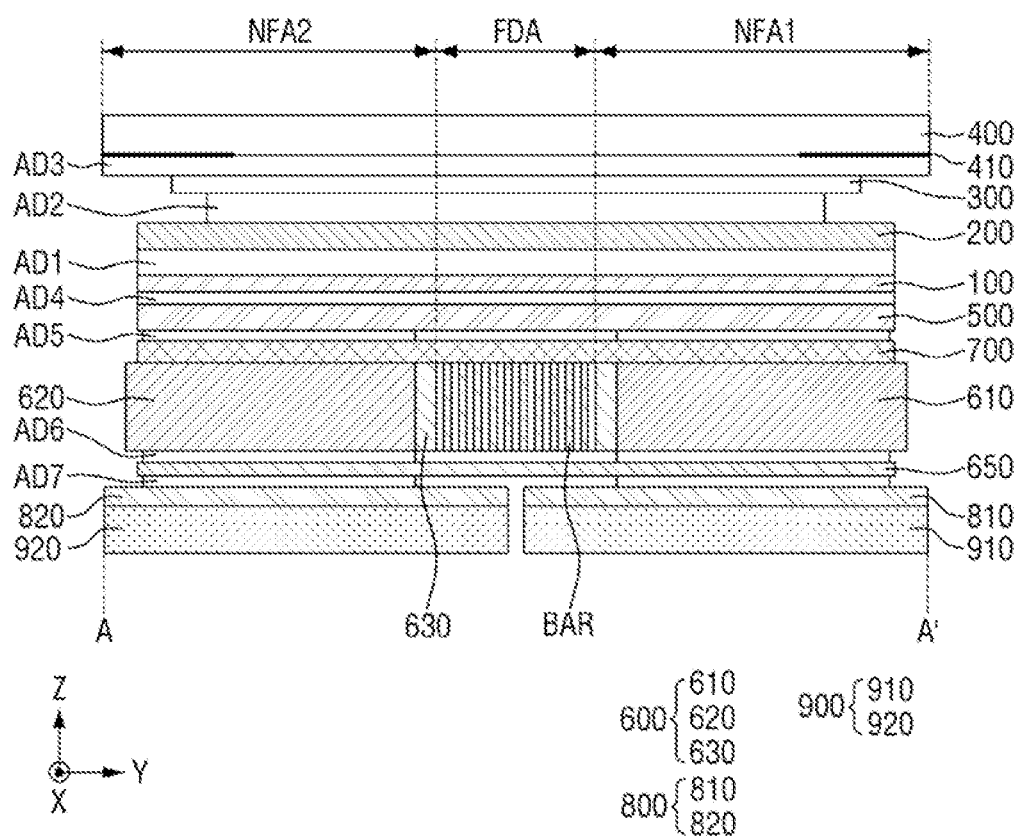
FIG. 13 is a cross-sectional view, taken along line A-A' of FIG. 5, of a display device according to an embodiment of the present disclosure.

FIG. 13 is a cross-sectional view, taken along line A-A' of FIG. 5, of a display device according to an embodiment of the present disclosure.

The embodiment of FIG. 13 differs from the embodiment of FIG. 11 in that a rigid member 600 includes first, second, and third rigid members 610, 620, and 630. The embodiment of FIG. 13 may be substantially the same as the embodiment of FIG. 12, except in in the placement of the digitizer layer 700, and so a description thereof will be omitted.

Figure 14:
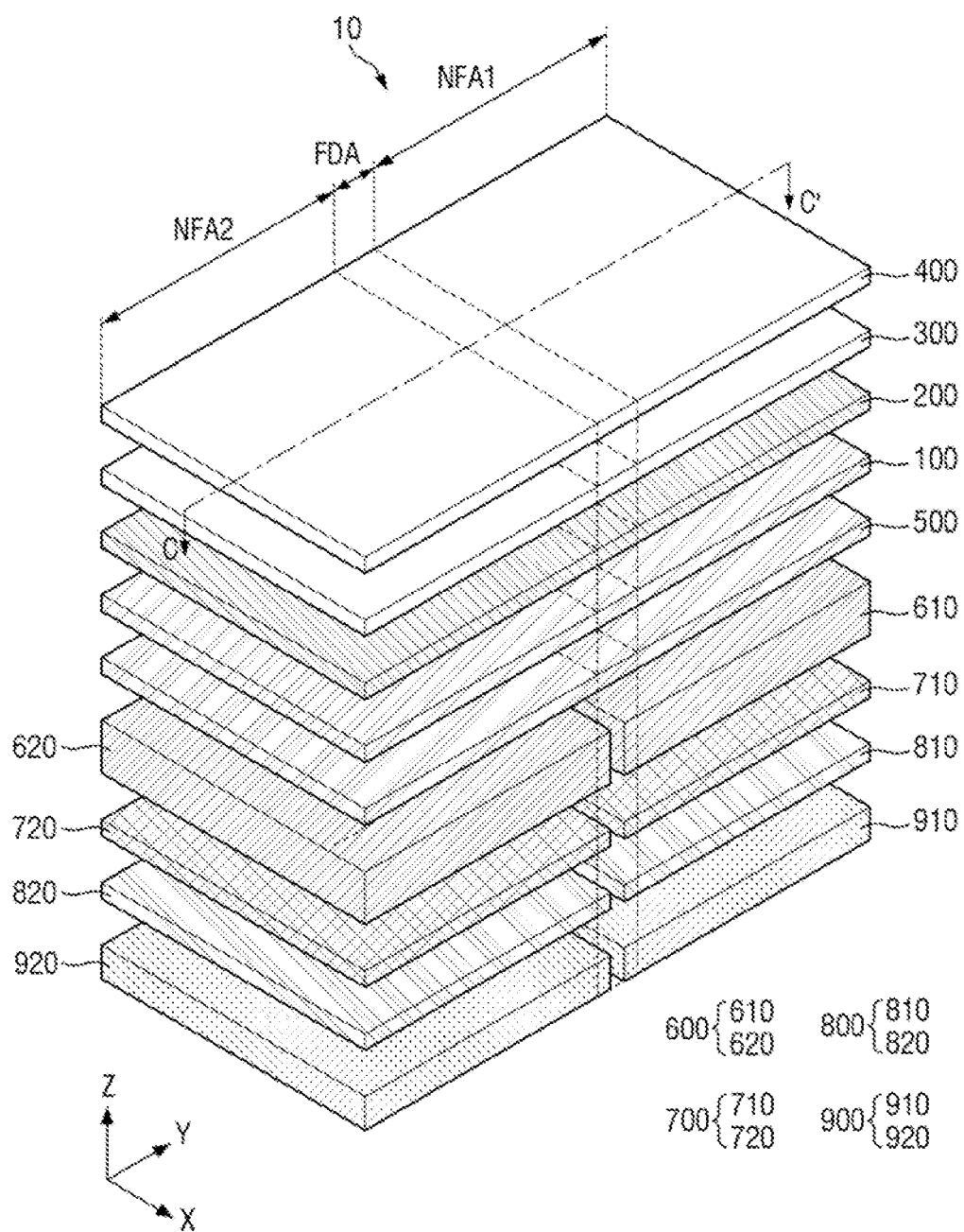
FIG. 14 is an exploded perspective view of a display device according to an embodiment of the present disclosure.
Figure 15:
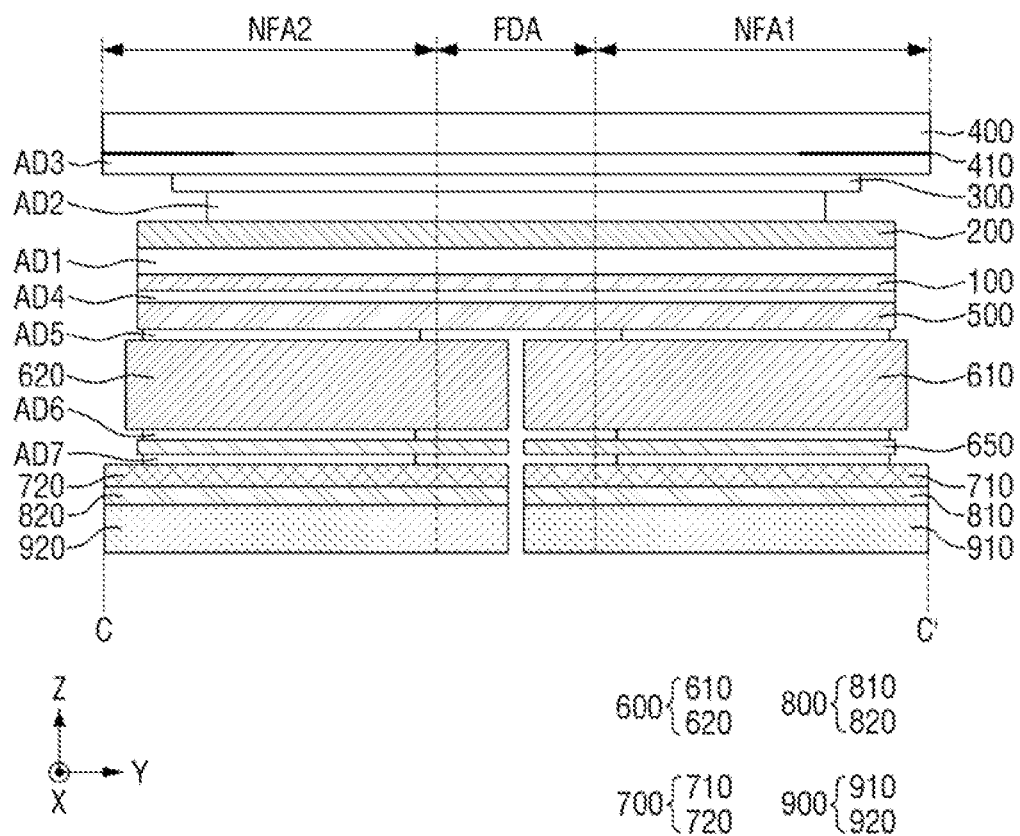
FIG. 15 is a cross-sectional view taken along line C-C' of FIG. 14.

FIG. 14 is an exploded perspective view of a display device according to an embodiment of the present disclosure. FIG. 15 is a cross-sectional view taken along line C-C' of FIG. 14.

The embodiment of FIGS. 14 and 15 differs from the embodiment of FIGS. 5 and 6 in that a rigid member 600 includes first and second rigid members 610 and 620. The embodiment of FIGS. 14 and 15 will hereinafter be described, focusing mainly on the differences with the embodiment of FIGS. 5 and 6.

Referring to FIGS. 14 and 15, the first rigid member 610 may be disposed in a first non-folding area NFA1, and the second rigid member 620 may be disposed in a second non-folding area NFA2. Accordingly, the folding stress of a display device 10 can be reduced.

Figure 16:
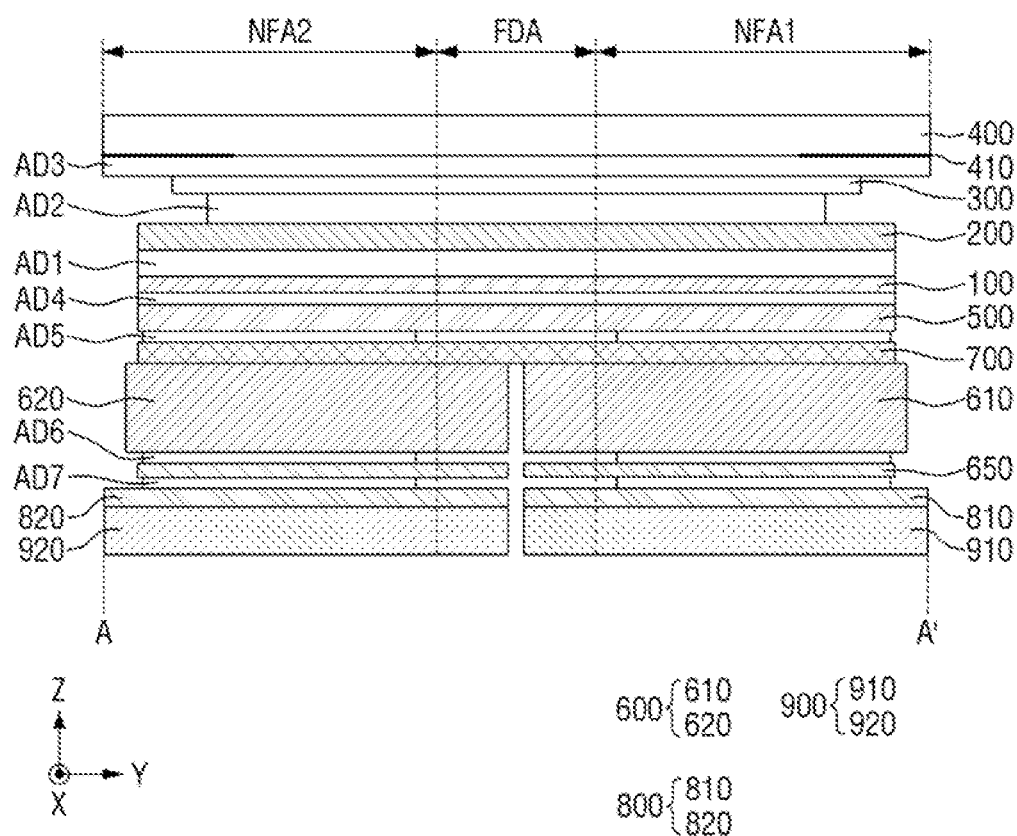
FIG. 16 is a cross-sectional view, taken along line C-C' of FIG. 14, of a display device according to an embodiment of the present disclosure.

FIG. 16 is a cross-sectional view, taken along line C-C' of FIG. 14, of a display device according to an embodiment of the present disclosure.

The embodiment of FIG. 16 differs from the embodiment of FIG. 11 in that a rigid member 600 includes first and second rigid members 610 and 620. The embodiment of FIG. 16 may be otherwise substantially the same as the embodiment of FIG. 15, and a detailed description thereof will be omitted.

In a display device according to an embodiment of the present inventive concept, as a rigid member is disposed on a digitizer layer and a shield member and is formed of a rigid material whose shape or volume is resistant to change by pressure from the outside, unevenness may not be formed in the rigid member despite height differences in the electrode patterns of the digitizer layer. Thus, unevenness may also not be formed in a protective film disposed on the rigid member. Therefore, any unevenness in the protective film can be prevented from becoming visible from the front of a display device due to height differences in the wiring of the digitizer layer in response to high-luminance light incident on the front of the display device when the display device 10 does not display an image.

While the present inventive concepts have been particularly shown and described with reference to the embodiments thereof, it will be understood by those of ordinary skill in the art that various changes in form and detail may be made thereto without departing from the spirit and scope of the present inventive concepts as set forth in the following claims.

What is claimed is:

1. A display device comprising:
   a display panel;
   a panel protecting film disposed on a rear surface of the display panel;
   a digitizer layer, wherein the digitizer layer includes first electrode patterns configured to generate a magnetic field and second electrode patterns configured to generate a magnetic field;
   a shield member disposed on a first surface of the digitizer layer; and
   a rigid member disposed on the panel protecting film between the display panel and the shield member, wherein the rigid member is adhered to the panel protecting film via an adhesive member, and further includes a plurality of bars and a plurality of slits which are disposed between adjacent bars among the plurality of bars, and
   wherein a width of each bar of the plurality of bars is smaller than a width of a slit adjacent to the bar of the plurality of slits.

2. The display device of claim 1, wherein the display panel includes:
   a folding area;
   a first non-folding area which is disposed on a first side of the folding area; and
   a second non-folding area which is disposed on a second side of the folding area.

3. The display device of claim 2, further comprising:
   a heat dissipation layer disposed on a first surface of the shield member.

4. The display device of claim 3, wherein:
   the heat dissipation layer includes a first heat dissipation layer which overlaps the first non-folding area in a thickness direction of the display panel, and a second heat dissipation layer which overlaps the second non-folding area in the thickness direction of the display panel; and
   a gap between the first heat dissipation layer and second heat dissipation layer overlaps the folding area.

5. The display device of claim 4, wherein the gap between the first heat dissipation layer and second heat dissipation layer is smaller than width of the folding area.

6. The display device of claim 2, wherein:
   the shield member includes a first shield member which at least partially overlaps the first non-folding area in a thickness direction of the display panel, and a second shield member which overlaps the second non-folding area in the thickness direction of the display panel; and
   a gap between the first shield member and second shield member overlaps the folding area.

7. The display device of claim 6, wherein the gap between the first shield member and second shield member is smaller than the width of the folding area.

8. The display device of claim 2, wherein the digitizer layer is disposed between the rigid member and the shield member.

9. The display device of claim 8, wherein:
   the digitizer layer includes a first digitizer layer which overlaps the first non-folding area, and a second digitizer layer which overlaps the second non-folding area;
   a gap between the first digitizer layer and second digitizer layer overlaps the folding area, and the gap between the first digitizer layer and second digitizer layer is smaller than the width of the folding area.

10. The display device of claim 1, wherein:
    the digitizer layer includes a base layer which has the first electrode patterns disposed on a top surface thereof and the second electrode patterns disposed on a bottom surface thereof;
    the first electrode patterns extend in a first direction; and
    the second electrode patterns extend in a second direction which intersects the first direction.

11. The display device of claim 10, wherein the first shield member and the second shield member include a magnetic metal powder.

12. The display device of claim 1, wherein a thickness of the rigid member is greater than a thickness of the digitizer layer.

13. The display device of claim 1, wherein a thickness of the rigid member is greater than a thickness of the shield member.

14. The display device of claim 1, wherein the digitizer layer is disposed between the display panel and the rigid member.

15. The display device of claim 1, wherein the rigid member includes a polymer having carbon fibers or glass fibers disposed therein.

16. A display device comprising:
    a display panel configured to display an image on a first surface thereof;
    a digitizer layer disposed on a second surface opposite to the first surface of the display panel, wherein the digitizer layer includes first electrode patterns configured to generate a magnetic field and second electrode patterns configured to generate a magnetic field;

a shield member disposed on a first surface of the digitizer layer; and a rigid member disposed between the display panel and the shield member, and wherein the display panel includes:
- a folding area;
- a first non-folding area which is disposed on, a first side of the folding area; and
- a second non-folding area which is disposed on a second side of the folding area, wherein:
  - the rigid member includes a first rigid member which overlaps the first non-folding area, and a second rigid member which overlaps the second non-folding area,
  - the digitizer layer includes a first digitizer layer which overlaps the first non-folding area, and a second digitizer layer which overlaps the second non-folding area,
  - a gap between the first rigid member and second rigid member and between the first digitizer layer and the second digitizer layer overlaps the folding area, and
  - the digitizer layer is disposed between the rigid member and the shield member.

17. The display device of claim 16, wherein the shield member includes a first shield member which overlaps the first non-folding area, and a second shield member which overlaps the second non-folding area, and wherein the first digitizer layer is between the first rigid member and the first shield member, and the second digitizer layer is between the second rigid member and the second shield member.

18. The display device of claim 16, further comprising: a heat dissipation member including a first heat dissipation member which overlaps the first non-folding area, and a second heat dissipation member which overlaps the second non-folding area, and wherein the first shield member is between the first digitizer layer and the first heat dissipation member, and the second shield member is between the second digitizer layer and the second heat dissipation member.

19. The display device of claim 16, further comprising: a first buffer member which overlaps the first non-folding area, and a second buffer member which overlaps the second non-folding area, and wherein the first buffer member is disposed between the first rigid member and the first digitizer layer and the second buffer member is disposed between the second rigid member and the second digitizer layer.

20. A display device comprising:

a display panel configured to display an image on a first surface thereof;

a digitizer layer disposed on a second surface opposite to the first surface of the display panel, wherein the digitizer layer includes first electrode patterns configured to generate a magnetic field and second electrode patterns configured to generate a magnetic field;

a shield member disposed on a first surface of the digitizer layer; and a rigid member disposed between the display panel and the shield member, wherein:

the rigid member includes a first rigid member which overlaps the first non-folding area, a second rigid member which overlaps the second non-folding area, and a plurality of bars which overlap the folding area;

the plurality of bars includes a different material from the first rigid member anti second rigid member, the plurality of bars includes a metallic material; and the first rigid member and second rigid member include carbon or glass fibers.

* * * * *